(12) United States Patent
Hempel et al.

(10) Patent No.: US 8,716,120 B2
(45) Date of Patent: May 6, 2014

(54) HIGH-K METAL GATE ELECTRODE STRUCTURES FORMED BY REDUCING A GATE FILL ASPECT RATIO IN REPLACEMENT GATE TECHNOLOGY

(75) Inventors: Klaus Hempel, Dresden (DE); Andy Wei, Dresden (DE); Martin Mazur, Pulsnitz (DE)

(73) Assignee: GLOBALFOUNDRIES Inc., Grand Cayman (KY)

( * ) Notice: Subject to any disclaimer, the term of this patent is extended or adjusted under 35 U.S.C. 154(b) by 0 days.

(21) Appl. No.: 13/489,539

(22) Filed: Jun. 6, 2012

(65) Prior Publication Data
US 2012/0319205 A1    Dec. 20, 2012

(30) Foreign Application Priority Data
Jun. 16, 2011   (DE) .......................... 10 2011 077 661

(51) Int. Cl.
*H01L 21/3205* (2006.01)
*H01L 21/4763* (2006.01)
(52) U.S. Cl.
USPC ............ 438/592; 438/588; 438/591; 257/368

(58) Field of Classification Search
USPC .......... 438/591–592, 588; 257/368, 331, 371, 257/E27.06, E21.19
See application file for complete search history.

(56) References Cited

U.S. PATENT DOCUMENTS

| | | |
|---|---|---|
| 2006/0081939 A1 | 4/2006 | Akasaka et al. |
| 2006/0278934 A1 | 12/2006 | Nagahama |
| 2008/0185637 A1 | 8/2008 | Nagaoka et al. |
| 2010/0052070 A1 | 3/2010 | Chung et al. |
| 2011/0248359 A1 * | 10/2011 | Hwang et al. ................. 257/410 |

OTHER PUBLICATIONS

Translation of Official Communication from German Patent Application No. 10 2011 077 661.3 dated Feb. 7, 2012.

* cited by examiner

*Primary Examiner* — Theresa T Doan
(74) *Attorney, Agent, or Firm* — Amerson Law Firm, PLLC

(57) ABSTRACT

When forming sophisticated high-k metal gate electrode structures on the basis of a replacement gate approach, the fill conditions upon filling in the highly conductive electrode metal, such as aluminum, may be enhanced by removing an upper portion of the final work function metal, for instance a titanium nitride material in P-channel transistors. In some illustrative embodiments, the selective removal of the metal-containing electrode material in an upper portion of the gate opening may be accomplished without unduly increasing overall process complexity.

21 Claims, 6 Drawing Sheets

HIGH-K METAL GATE ELECTRODE STRUCTURES FORMED BY REDUCING A GATE FILL ASPECT RATIO IN REPLACEMENT GATE TECHNOLOGY

BACKGROUND OF THE INVENTION

1. Field of the Invention

Generally, the present disclosure relates to the fabrication of sophisticated integrated circuits including transistor elements comprising gate structures on the basis of a high-k gate dielectric material.

2. Description of the Related Art

The fabrication of advanced integrated circuits, such as CPUs, storage devices, ASICs (application specific integrated circuits) and the like, requires the formation of a large number of circuit elements on a given chip area according to a specified circuit layout, wherein field effect transistors represent one important type of circuit element that substantially determines performance of the integrated circuits. Generally, a plurality of process technologies are currently practiced, wherein, for many types of complex circuitry including field effect transistors, CMOS technology is currently one of the most promising approaches due to the superior characteristics in view of operating speed and/or power consumption and/or cost efficiency. During the fabrication of complex integrated circuits using, for instance, CMOS technology, millions of transistors, i.e., N-channel transistors and P-channel transistors, are formed on a substrate including a crystalline semiconductor layer. A field effect transistor, irrespective of whether an N-channel transistor or a P-channel transistor is considered, typically comprises PN junctions that are formed by an interface of highly doped regions, referred to as drain and source regions, with a slightly doped or non-doped region, such as a channel region, disposed adjacent to the highly doped regions. In a field effect transistor, the conductivity of the channel region, i.e., the drive current capability of the conductive channel, is controlled by a gate electrode formed adjacent to the channel region and separated therefrom by a thin insulating layer. The conductivity of the channel region, upon formation of a conductive channel due to the application of an appropriate control voltage to the gate electrode, depends on, among other things, the dopant concentration, the mobility of the charge carriers and, for a given extension of the channel region in the transistor width direction, the distance between the source and drain regions, which is also referred to as channel length. Hence, the conductivity of the channel region substantially affects the performance of MOS transistors. Thus, the scaling of the channel length, and associated therewith the reduction of channel resistivity, is a dominant design criterion for accomplishing an increase in the operating speed of the integrated circuits.

Presently, the vast majority of integrated circuits are based on silicon due to its substantially unlimited availability, the well-understood characteristics of silicon and related materials and processes and the experience gathered during the last 50 years. Therefore, silicon will likely remain the material of choice for future circuit generations designed for mass products. One reason for the importance of silicon in fabricating semiconductor devices has been the superior characteristics of a silicon/silicon dioxide interface that allows reliable electrical insulation of different regions from each other. The silicon/silicon dioxide interface is stable at high temperatures and, thus, allows performing subsequent high temperature processes, as are required, for example, for anneal cycles to activate dopants and to cure crystal damage without sacrificing the electrical characteristics of the interface.

For the reasons pointed out above, in field effect transistors, silicon dioxide is preferably used as a base material of the thin gate insulation layer that separates the gate electrode, frequently comprised of polysilicon or metal-containing materials, from the silicon channel region. In steadily improving device performance of field effect transistors, the length of the channel region has been continuously decreased to improve switching speed and drive current capability. Since the transistor performance is controlled by the voltage supplied to the gate electrode to invert the surface of the channel region to a sufficiently high charge density for providing the desired drive current for a given supply voltage, a certain degree of capacitive coupling, provided by the capacitor formed by the gate electrode, the channel region and the silicon dioxide disposed therebetween, has to be maintained. It turns out that decreasing the channel length requires an increased capacitive coupling to avoid the so-called short channel behavior during transistor operation. The short channel behavior may lead to an increased leakage current and to a pronounced dependence of the threshold voltage on the channel length. Aggressively scaled transistor devices with a relatively low supply voltage and thus reduced threshold voltage may suffer from an exponential increase of the leakage current, while also requiring enhanced capacitive coupling of the gate electrode to the channel region. Thus, the thickness of the silicon dioxide layer has to be correspondingly reduced to provide the required capacitance between the gate and the channel region. For example, a channel length of approximately 0.08 µm may require a gate dielectric made of silicon dioxide as thin as approximately 1.2 nm. The relatively high leakage current, however, caused by direct tunneling of charge carriers through an ultra-thin silicon dioxide based gate insulation layer may reach values for an oxide thickness in the range of 1-2 nm that may not be compatible with thermal design power requirements for many types of circuits.

Therefore, replacing silicon dioxide based dielectrics as the material for gate insulation layers has been considered, particularly for devices requiring extremely thin silicon dioxide based gate dielectric layers. Possible alternative materials include materials that exhibit a significantly higher permittivity so that a physically greater thickness of a correspondingly formed gate insulation layer results in a capacitive coupling that would otherwise only be obtained by an extremely thin silicon dioxide layer.

Additionally, transistor performance may be increased by providing an appropriate conductive material for the gate electrode so as to replace the usually used polysilicon material, since polysilicon may suffer from charge carrier depletion at the vicinity of the interface to the gate dielectric, thereby reducing the effective capacitance between the channel region and the gate electrode. Thus, a gate stack has been suggested in which a high-k dielectric material provides enhanced capacitance based on the same thickness as a silicon dioxide based layer, while additionally maintaining leakage currents at an acceptable level. On the other hand, the non-polysilicon material, such as titanium nitride and the like, in combination with other metals, may be formed so as to connect to the high-k dielectric material, thereby substantially avoiding the presence of a depletion zone. Since the threshold voltage of the transistors, which represents the voltage at which a conductive channel forms in the channel region, is significantly determined by the work function of the metal-containing gate material, an appropriate adjustment of the effective work function with respect to the conductivity type of the transistor under consideration has to be guaranteed.

Providing different metal species for adjusting the work function of the gate electrode structures for P-channel transistors and N-channel transistors at an early manufacturing stage may, however, be associated with a plurality of difficulties, which may stem from the fact that a complex patterning sequence may be required during the formation of the sophisticated high-k metal gate stack, which may result in a significant variability of the resulting work function and thus threshold of the completed transistor structures.

For this reason, in other approaches, the initial gate electrode stack may be provided with a high degree of compatibility with conventional polysilicon-based process strategies and the actual electrode metal and the final adjustment of the work function of the transistors may be accomplished in a very advanced manufacturing stage, i.e., after completing the basic transistor structure.

A corresponding manufacturing strategy is also referred to as a replacement gate approach or technology in which at least the adjustment of the work function, i.e., the incorporation of appropriate work function metal species, is accomplished in a very late manufacturing stage. Furthermore, in some cases, the high-k dielectric material may be formed upon patterning the gate electrode structure, thereby avoiding the deposition of the high-k dielectric material, possibly in combination with an additional very thin silicon oxide material in a very late manufacturing stage. In other cases, a so-called full replacement approach may be applied by forming the high-k dielectric material in a late manufacturing stage together with the work function metal species and the actual electrode metal. Generally, the replacement gate strategy is a very promising technology, wherein, however, upon further scaling the transistor dimensions and thus the gate length, increasingly, deposition-related irregularities are caused upon filling in the actual electrode metal, as will be explained in more detail with reference to FIG. 1.

FIG. 1 schematically illustrates a cross-sectional view of a semiconductor device 100 in a final stage of a replacement gate approach. As shown, the device 100 comprises a substrate 101, such as a semiconductor material or any other appropriate carrier material for forming thereon a semiconductor layer 102, such as a silicon layer, a silicon/germanium layer and the like. The semiconductor layer 102 is typically divided into a plurality of semiconductor regions or active regions on the basis of appropriate isolation structures (not shown) in order to define the lateral size and positions for forming transistor elements. For example, in FIG. 1, a first active region 102A, which may correspond to an N-channel transistor 150A and a second active region 102B corresponding to a P-channel transistor 150B are depicted. In this manufacturing stage, the transistors 150A, 150B comprise drain and source regions 151 and a channel region 152 having appropriate dopant profiles so as to correspond to the characteristics of the transistors 150A, 150B. Furthermore, a contact level 120 is provided in an intermediate manufacturing stage and may comprise appropriate dielectric materials, such as a dielectric layer 121 and a dielectric layer 122, which are typically provided in the form of silicon nitride and silicon dioxide, respectively. The dielectric materials 122, 121 laterally enclose gate electrode structures 160A, 160B of the transistors 150A, 150B, respectively. As discussed above, initially the gate electrode structures 160A, 160B may be provided in the form of well-established polysilicon/silicon dioxide gate electrode structures, wherein at least the polysilicon material has been removed and is thus replaced by an appropriate material system. For example, a first layer 161A is illustrated and is to represent at least a metal-containing electrode material, while in some cases the layer 161A may also represent a high-k dielectric material, possibly in combination with an oxide layer 166, while in other cases, as discussed above, the layer 166 may represent a high-k dielectric material provided in an early manufacturing stage, possibly in combination with an additional conventional dielectric material (not shown). The layer 161A typically comprises an appropriate work function metal species, such as lanthanum and the like, possibly in combination with titanium nitride, wherein at least one conductive barrier or etch stop layer, such as tantalum nitride, is provided so as to protect and passivate any underlying materials. Furthermore, the layer 161A is also provided in the gate electrode structure 160B in combination with a second metal-containing electrode material 161B, which may be provided in the form of titanium nitride and which may provide a desired work function of the gate electrode structure 150B in combination with the previously provided material layer 161A. Moreover, in the manufacturing stage shown, an electrode metal 162, such as aluminum and the like, is formed in the gate electrode structures 160A, 160B, which, however, may result in deposition-related irregularities, such as a void 162V, in particular in the gate electrode structure 160B which has a reduced width for filling in the electrode metal 162 due to the presence of the layer 161B.

The semiconductor device 100 as illustrated in FIG. 1 may be formed on the basis of the following process strategy. In an early phase, the active regions 102A, 102B are formed by incorporating appropriate dopant species for defining the basic characteristics of the transistors 150A, 150B, while the lateral position, size and shape of the active regions 102A, 102B is determined by providing an appropriate isolation structure, such as a shallow trench isolation. To this end, well-established manufacturing techniques, including implantation processes and masking regimes for incorporating an appropriate well dopant species may be applied, while isolation structures may be formed by using sophisticated lithography, etch, deposition, anneal and planarization techniques. Thereafter, the gate electrode structures 160A, 160B are formed in an initial and thus preliminary state by, for instance, forming an appropriate silicon dioxide-based dielectric material followed by polysilicon material and any additional sacrificial materials, such as hard mask materials and the like, as required for patterning the gate electrode structures 160A, 160B in compliance with the overall design rules of the device 100. For example, in sophisticated applications, a gate length of 40 nm and less has to be implemented, wherein sophisticated transistors may even require a gate length of 30 nm and less in the device 100. Thereafter, the processing is continued by, for instance, forming a spacer structure 163 and also providing the drain and source regions 151 using well-established process techniques, such as implantation processes, selective epitaxial growth techniques and the like. If required, anneal processes are applied in order to activate dopant species and re-crystallize implantation-induced damage. Next, the contact level 120 is formed by depositing the materials 121, 122, for instance by applying chemical vapor deposition (CVD) techniques, spin-on techniques and the like, possibly in combination with planarization processes in order to provide a planar surface. Thereafter, any excess material is removed so as to finally expose a surface of the placeholder material, i.e., of the polysilicon material, which is then removed by using highly selective etch recipes, thereby forming respective openings in the gate electrode structures 160A, 160B. Thereafter, the layer 161A is deposited, for instance, by using very conformal CVD-like deposition techniques, such as atomic layer deposition (ALD), which may include the deposition of a high-k dielectric material, as discussed above, while in other cases a corresponding high-k dielectric material may have been formed in an early manufacturing stage. The deposition of the layer 161A comprises the deposition of at least one metal-containing electrode material, such as tantalum nitride, that is formed in a highly conformal manner so as to act as an etch stop material without unduly deteriorating the overall electronic characteristics and conductivity of the gate electrode structures 160A, 160B. As discussed above, when realizing a gate length of 40 nm and significantly less, the material layer 161A, possibly including the high-k dielectric material, has to be deposited into a high aspect ratio opening obtained by the removal of the placeholder material. Typically, the layer 161A is formed with a thickness of several nm when comprising a high-k dielectric material and an appropriate work function adjusting material layer. Consequently, upon forming the layer 161B, for instance in the form of a titanium nitride material, which may have to be provided with a significantly increased thickness of up to 5 nm and more, in order to obtain the required electronic characteristics of the gate electrode structure 160B, even more sophisticated deposition conditions are encountered during the deposition of the layer 161B. To this end, also highly conformal deposition recipes are applied, for instance on the basis of ALD and the like. Next, typically, appropriate lithography techniques and etch strategies are applied so as to selectively remove the layer 161B from the gate electrode structure 160A. Thereafter, the processing is continued by depositing the electrode metal 162, for instance in the form of aluminum. Due to the previous deposition of the layer 161B, however, the resulting width of the gate opening is significantly reduced, for instance by approximately 10 nm for a layer thickness of 5 nm, thereby significantly increasing the probability of creating voids 162V in the gate electrode structure 160B, which in turn has a pronounced impact on the overall characteristics of the transistor 150B, which may even result in a total failure of the transistor 150B. In order to attempt to completely fill the gate electrode structures 160A, 160B, it has been suggested to use a CVD deposition for aluminum which, however, may require, due to the self-limiting nature of the CVD-aluminum deposition processes, an additional titanium seed layer, which may cause a non-desired overhang at the top of the gate structures, thereby even further reducing the available gap, in particular in the gate electrode structure 160B upon depositing the actual electrode metal 162.

Since it is extremely difficult to completely fill the gate electrode structures having an aspect ratio, i.e., a ratio of length of the corresponding gate openings with respect to the depth thereof, of up to 10, other strategies have been proposed in order to reduce the sophisticated aspect ratio. For example, in some conventional approaches, it has been proposed to reduce the aspect ratio by increasing the width of the gate openings, for instance upon or after removing the placeholder material by using appropriate material erosion processes, such as plasma assisted etch processes, ion sputtering techniques and the like. In this manner, a substantially tapered cross-sectional shape of the corresponding gate openings, as indicated by 168, may be obtained, thereby significantly reducing the complexity of the subsequent deposition processes. In this manner, even the initially high aspect ratio openings may be reliably filled with the electrode metal 162. Since the tapered portion 168 may, however, result in a significantly increased gate length at the upper portions of the gate electrode structures 150A, 150B, in particular in densely packed device areas, the increased gate length may be in conflict with a contact regime in which contact elements are to be formed in the contact level 120 adjacent to the gate electrode structures 160A, 160B so as to connect to the drain and/or source regions 151. In this case, an increased pitch between closely spaced gate electrode structures has to be implemented, thereby significantly increasing the overall lateral size of complex semiconductor devices.

The present disclosure is directed to various methods and devices that may avoid, or at least reduce, the effects of one or more of the problems identified above.

SUMMARY OF THE INVENTION

The following presents a simplified summary of the invention in order to provide a basic understanding of some aspects of the invention. This summary is not an exhaustive overview of the invention. It is not intended to identify key or critical elements of the invention or to delineate the scope of the invention. Its sole purpose is to present some concepts in a simplified form as a prelude to the more detailed description that is discussed later.

The present disclosure generally contemplates semiconductor devices and manufacturing techniques in which an electrode metal may be filled into gate openings by reducing the aspect ratio. To this end, at least one metal-containing electrode material is removed in an upper portion of the gate opening prior to filling in the electrode metal, thereby obtaining an increased width at the upper portion without influencing the overall electronic characteristics of the gate electrode structure under consideration. That is, since the metal-containing electrode material, such as a titanium nitride material, is required in a lower portion of the gate electrode structure only in order to appropriately adjust the work function, the selective removal of this layer in the upper portion of the gate electrode structure may significantly reduce the aspect ratio without changing the electronic characteristics. In some illustrative embodiments, the selective removal of the last metal-containing electrode material and thus the reduction of the aspect ratio may be accomplished on the basis of a process sequence without requiring any undue additional process steps, such as additional lithography steps and the like. In this manner, superior fill conditions may be achieved, even for transistor devices requiring a gate length of 40 nm and less, without affecting the overall electronic characteristics and without unduly contributing to additional process complexity.

One illustrative method disclosed herein includes forming a metal-containing electrode material in a gate opening of a first gate electrode structure of a first transistor and a gate opening of a second gate electrode structure of a second transistor. The method further includes forming a sacrificial material selectively in the gate opening of the second gate electrode structure so as to cover a portion of the metal-containing electrode material at a bottom of the gate opening of the second gate electrode structure, while the metal-containing electrode material in an upper portion of the gate opening of the second gate electrode structure and in the gate opening of the first gate electrode structure is exposed. Additionally, the method includes removing the exposed metal-containing electrode material from the gate opening of the first gate electrode structure while using the sacrificial material as an etch mask so as to preserve the metal-containing electrode material at the bottom of the gate opening of the second gate electrode structure. The method further includes removing the sacrificial material from the gate opening of the second gate electrode structure. Moreover, a conductive fill material is formed in the gate openings of the first and second gate electrode structures.

A further illustrative method disclosed herein relates to forming gate electrode structures. The method includes forming a gate opening in a first gate electrode structure and a second gate electrode structure. Moreover, a first metal-containing material layer is formed on surface areas of the gate opening of the first and second gate electrode structures. The method further includes forming a second metal-containing material layer on the first metal-containing material layer. The method further includes removing the second metal-containing material layer from the gate opening of the first gate electrode structure and from an upper portion of the gate opening of the second gate electrode structure while preserving the second metal-containing material layer at a lower portion of the gate opening of the second gate electrode structure. Additionally, the method includes forming an electrode metal on the first metal-containing material layer and on the second metal-containing material layer that is preserved at the lower portion.

One illustrative semiconductor device disclosed herein includes a first transistor that has a first gate electrode structure. The first gate electrode structure includes a first electrode metal formed on a metal-containing electrode material of a first type, wherein the first electrode metal is laterally enclosed by the metal-containing electrode material of the first type. The semiconductor device further includes a second transistor having a second gate electrode structure, which in turn includes a second electrode metal. The second electrode metal has an upper portion and a lower portion, wherein the lower portion is formed on a metal-containing electrode material of a second type and is laterally enclosed by the metal-containing electrode material of the second type. The upper portion of the second electrode metal is formed on the lower portion and is laterally enclosed by a metal-containing electrode material of the first type.

BRIEF DESCRIPTION OF THE DRAWINGS

The disclosure may be understood by reference to the following description taken in conjunction with the accompanying drawings, in which like reference numerals identify like elements, and in which.

Figure 1:
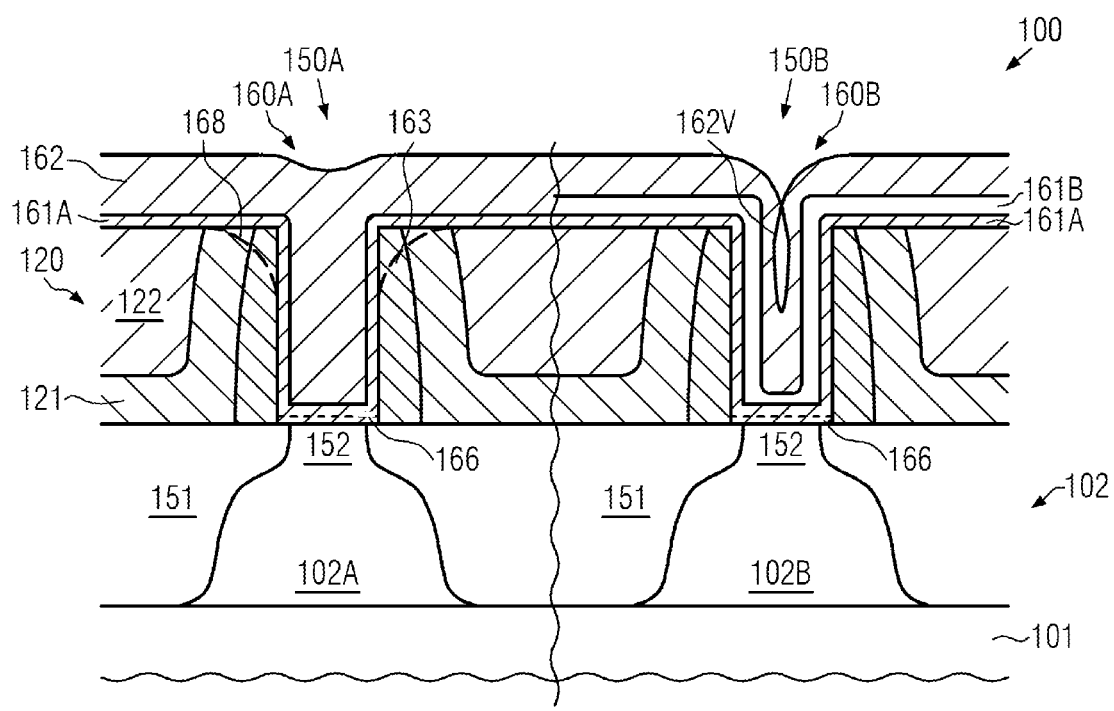
FIG. 1 schematically illustrates a cross-sectional view of a sophisticated semiconductor device during a final phase of a replacement gate approach performed on the basis of conventional process strategies.

While the subject matter disclosed herein is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION

Various illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

The present subject matter will now be described with reference to the attached figures. Various structures, systems and devices are schematically depicted in the drawings for purposes of explanation only and so as to not obscure the present disclosure with details that are well known to those skilled in the art. Nevertheless, the attached drawings are included to describe and explain illustrative examples of the present disclosure. The words and phrases used herein should be understood and interpreted to have a meaning consistent with the understanding of those words and phrases by those skilled in the relevant art. No special definition of a term or phrase, i.e., a definition that is different from the ordinary and customary meaning as understood by those skilled in the art, is intended to be implied by consistent usage of the term or phrase herein. To the extent that a term or phrase is intended to have a special meaning, i.e., a meaning other than that understood by skilled artisans, such a special definition will be expressly set forth in the specification in a definitional manner that directly and unequivocally provides the special definition for the term or phrase.

The present disclosure generally provides manufacturing techniques and semiconductor devices in which the gap width of a gate opening in a final stage of a replacement gate approach may be increased by removing a final metal-containing electrode material selectively in an upper portion prior to filling in the highly conductive fill metal, such as aluminum and the like. In this manner, substantially similar deposition conditions may be provided for any type of gate electrode structure upon depositing the highly conductive fill metal on the basis of any desired deposition technique, while, on the other hand, by preserving the metal-containing electrode material in the lower portion of a gate electrode structure under consideration, the electronic characteristics thereof are substantially not affected since the final work function is substantially determined by the lower portion of the metal-containing electrode material. For example, frequently, the final metal-containing electrode material of one type of transistor, for instance for a P-channel transistor, has to be provided with an increased thickness of up to several nanometers, which in turn may significantly reduce the available gap width of the gate opening for the final deposition step for filling in the highly conductive electrode metal. In this case, the aspect ratio of the resulting gate opening after incorporating the final metal-containing electrode material may be reduced by providing an increased width at the upper portion of the gate opening so that a reliable filling in of the electrode metal may be accomplished. In some illustrative embodiments, the selective removal of the final work function metal layer in one type of transistor may be accomplished within the process sequence for generally patterning the last work function metal layer so that the overall process complexity may substantially not increase, while at the same time superior production yield is obtained, even when contemplating semiconductor devices requiring the fabrication of transistors having a gate length of 40 nm and significantly less. In this manner, well-established replacement gate technologies are endowed with scalability to extremely small gate lengths without requiring a significant modification of the overall process strategy.

With reference to FIGS. 2a-2i, further illustrative embodiments will now be described in more detail, wherein reference may also be made to FIG. 1, if appropriate.

Figure 2A:
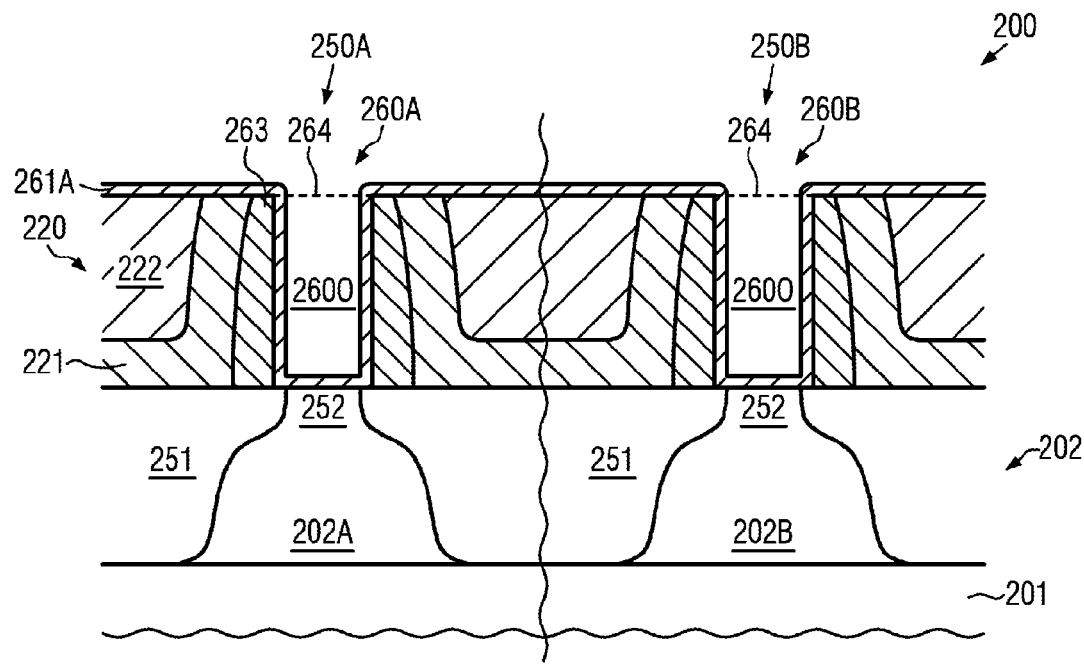
FIGS. 2a-2i schematically illustrate cross-sectional views of a semiconductor device during various manufacturing stages when forming sophisticated high-k metal gate electrode structures on the basis of a replacement gate technology with superior fill conditions for providing the highly conductive electrode metal, according to illustrative embodiments.

FIG. 2a schematically illustrates a cross-sectional view of a semiconductor device 200 in an advanced manufacturing stage. As shown, the device 200 may comprise a substrate 201 and a semiconductor layer 202 formed thereon, wherein these components may have any appropriate configuration, as for instance also discussed above with reference to the device 100. For example, the semiconductor layer 202 and the substrate 201 may form a bulk configuration in which the semiconductor layer 202 is directly connected to a crystalline material of the substrate 201. In other cases, the layer 202 and the substrate 201 may form a silicon-on-insulator (SOI) architecture when a buried insulating material (not shown) is formed directly below the semiconductor layer 202. The layer 202 is divided into a plurality of active regions, which may be accomplished by providing appropriate isolation structures (not shown), as is also discussed above with reference to the device 100. For convenience, a first active region 202A and a second active region 202B are illustrated, which in some illustrative embodiments may correspond to a first transistor 250A, such as an N-channel transistor, and a second transistor 250B, such as a p-channel transistor. In the manufacturing stage shown, the transistors 250A, 250B may comprise drain and source regions 251, a channel region 252 and gate electrode structures 260A, 260B, respectively. The gate electrode structures 260A, 260B are laterally embedded in a device level 220, which, in the manufacturing stage shown, may be provided in the form of an appropriate dielectric material system, for instance comprising a dielectric layer 221 and an interlayer dielectric material 222. It should be appreciated that the transistors 250A, 250B may have incorporated therein any appropriate mechanism for further enhancing the overall performance, for instance in the form of any embedded semiconductor alloys, for instance for incorporating an appropriate dopant profile and/or for inducing a desired type of strain in the channel regions 252 and the like. Moreover, in the example shown, the transistors 250A, 250B may represent planar transistor architectures, while, in other cases, in addition or alternatively to planar transistors, also three-dimensional transistors, such as multiple gate transistors or FinFET transistors, may be provided. In this case, the gate electrode structures 260A, 260B may extend into the semiconductor layer 202 at certain areas of the device, thereby even further contributing to a pronounced and sophisticated surface topography during the further processing of the device 200. The components of the semiconductor device 200 described so far may be formed on the basis of any appropriate process strategy, for instance by using techniques as are also discussed above with reference to the semiconductor device 100. That is, the basic transistor configuration as shown in FIG. 2a may be formed on the basis of a conventional gate electrode structure, i.e., on the basis of an appropriate placeholder material 264, such as polysilicon, silicon/germanium and the like, possibly in combination with one or more additional dielectric cap materials (not shown) so as to adjust the required gate length, i.e., in FIG. 2a, the horizontal extension of the gate electrode structures 260A, 260B between a corresponding sidewall spacer structure 263.

After performing any high temperature processes and possibly after forming additional contact areas in the drain and source regions 251, for instance in the form of metal silicide regions (not shown), if considered appropriate, the processing is continued by forming the device level 220 and removing any excess material, thereby finally exposing a surface of the placeholder material 264. On the basis of well-established highly selective etch recipes, the material 264 may be removed, thereby forming the gate openings 260O, the width of which may be substantially determined by the spacer structure 263. It should be appreciated that the "width" of the openings 260O may substantially represent the length of the gate electrode structures 260A, 260B except for an additional layer thickness of a high-k dielectric material, which, in some illustrative embodiments, may be formed on exposed surface areas of the opening 260O. To this end, well-established highly conformal CVD-like deposition techniques, such as ALD, may be used. In this manner, an appropriate high-k dielectric material (not shown) may be deposited, wherein the deposition process may be preceded by forming an oxide layer on the surface of the channel region 252, for instance on the basis of wet chemical oxidation recipes and the like. In other approaches, as for instance also discussed above with reference to the semiconductor device 100, a high-k dielectric material may be provided in an early manufacturing stage and may be preserved upon forming the gate opening 260O so that a deposition of any further dielectric material may not be required in this manufacturing stage.

Thereafter, a layer or layer system 261A is formed, for instance by highly conformal deposition techniques, wherein appropriate work function metal species and at least one metal-containing electrode material, which may also act as an etch stop or barrier layer, may be provided. To this end, highly conformal ALD techniques may be used, as for instance discussed above with reference to the device 100, while in other cases any other appropriate deposition recipe may be applied, such as electrochemical deposition processes and the like. Consequently, the metal-containing electrode material 261A may be formed with a desired thickness on any exposed surface areas and thus within the gate openings 260O, wherein, as discussed above, any additional layer or layers may be formed, such as a high-k dielectric material, prior to forming the metal-containing electrode material.

Figure 2B:
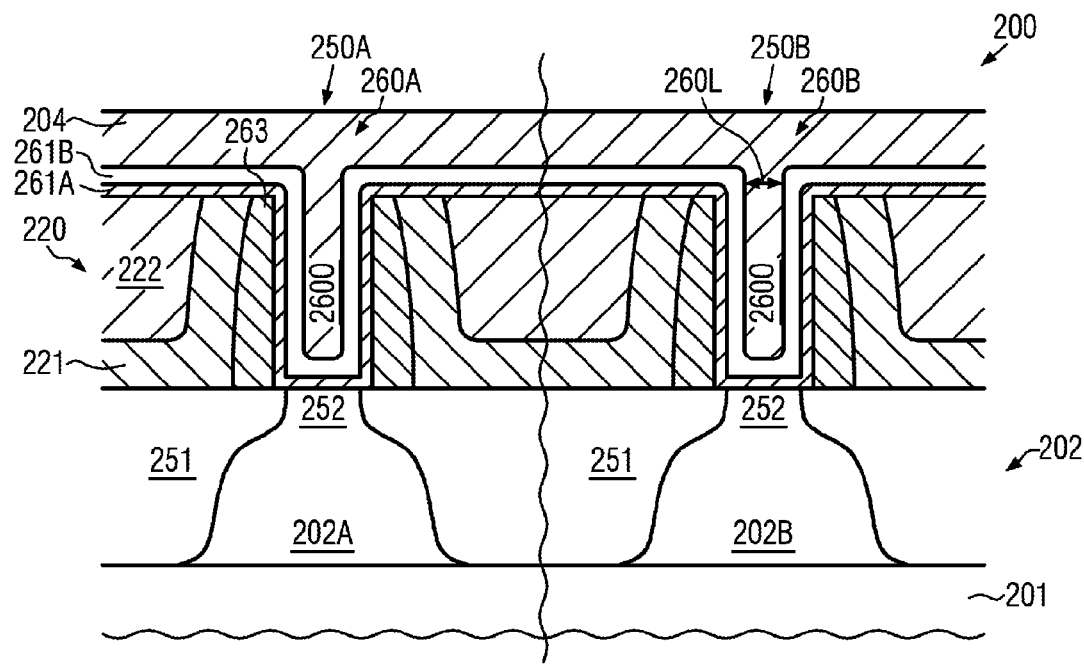

FIG. 2b schematically illustrates the device 200 in a further advanced manufacturing stage. As shown, a second metal-containing electrode material 261B, for instance in the form of titanium nitride and the like, possibly including an additional work function metal species, may be formed on the layer 261A and may have any appropriate thickness, for instance in the range of one to several nanometers, thereby restricting the width or length of the opening 260O, as indicated by 260L. Furthermore, in the manufacturing stage shown, a sacrificial material 204 may be formed in the gate openings 260O and above the contact level 220. The sacrificial material 204 may be provided in a low viscous state so as to obtain a substantially planar surface topography, which may also provide superior conditions for a subsequent lithography process to be applied so as to selectively remove the material 261B at least from the gate opening 260O. To this end, a plurality of well-established materials are available, such as Accufell or "Duo," while also other appropriate optical planarization materials may be used.

Figure 2C:
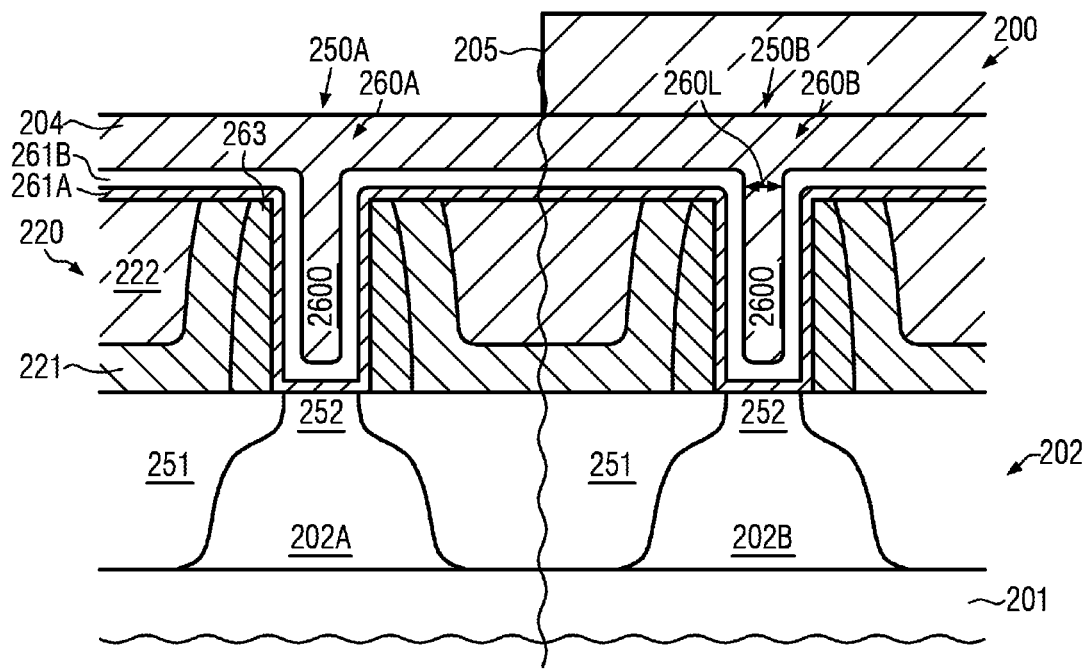

FIG. 2c schematically illustrates the device 200 in a further advanced manufacturing stage. As shown, a further sacrificial material in the form of a mask 205 may be formed so as to cover the transistor 250B and expose the transistor 250A, i.e., the sacrificial fill material 204 formed thereabove. The mask 205 may be provided in the form of a resist mask, which may include the deposition of an appropriate resist material and patterning the same by performing a lithography process and developing the exposed resist material to obtain the mask 205.

Figure 2D:
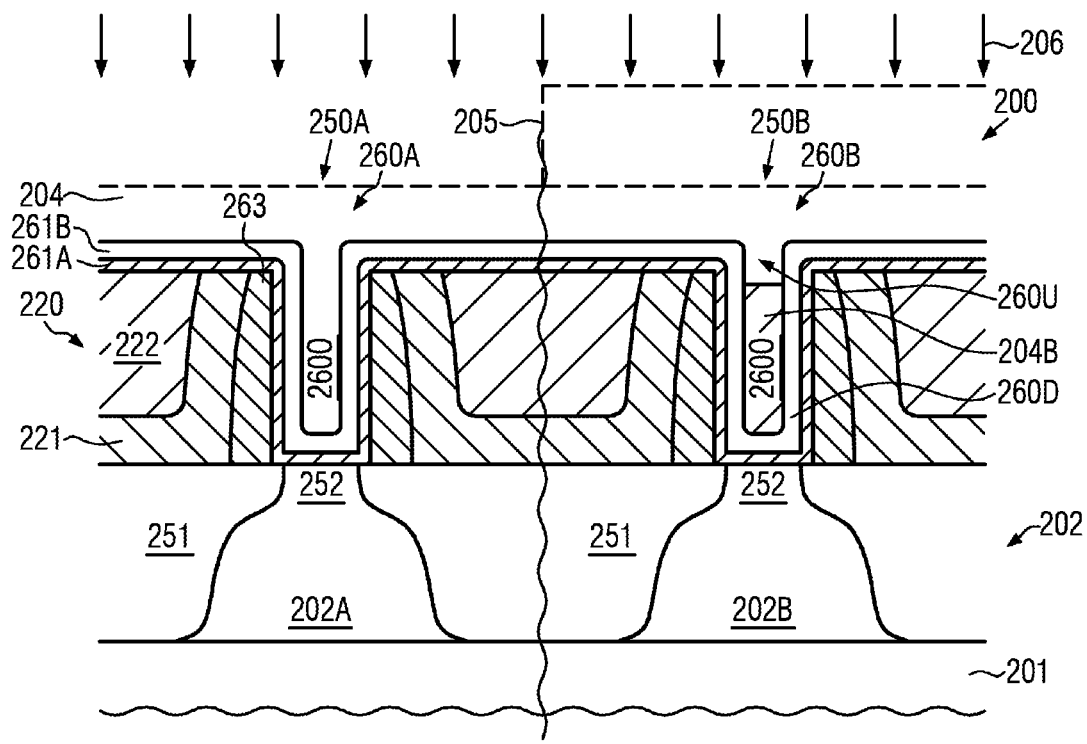

FIG. 2*d* schematically illustrates the device 200 in a further advanced manufacturing stage according to some illustrative embodiments. In this case, the device 200 may be exposed to an etch ambient 206 established on the basis of a plasma that is appropriate for removing a portion of the sacrificial fill material 204 above the transistor 250A which is not covered by the mask 205. For example, the etch process 206 may be established on the basis of an appropriate reactive gas component, such as a carbon and fluorine-containing gas, possibly in combination with additional gas components, such as carbon oxide, argon, oxygen and nitrogen, wherein, in some illustrative embodiments, the process parameters are adjusted such that the mask 205 and at least exposed portions of the material 204 are commonly removed. In this case, the material 204 may be substantially completely removed from the gate opening 260O of the gate electrode structure 260A, while also efficiently removing the mask 205 and a portion of the material 204 formed above the gate electrode structure 260B. Furthermore, also a certain amount of the material 204 may be removed from the opening 260O of the second gate electrode structure 260B while, however, at least a portion 204B may be preserved. To this end, for given etch parameters, also the thickness of the mask 205 and/or of the sacrificial layer 204 may be appropriately selected so as to preserve the portion 204B in the gate opening 260O of the gate electrode structure 260B. In this manner, in an upper portion 260U of the opening 260O, the material 261B may also be reliably exposed in the gate electrode structure 260B, while, on the other hand, in a lower portion 260D, the material 204B may still reliably cover the material 261B. For example, for given etch parameters and a given height or thickness of the materials 204 and 205, the degree of material removal in the gate electrode structure 260B may be adjusted by appropriately selecting an "over-etch time" of the process 206, while, in other cases, if considered appropriate, an additional etch step may be implemented so as to remove an additional portion of the material 204B so as to adjust a desired final height within the gate opening 260O of the gate electrode structure 260B.

Consequently, in this situation, the device 200 may be ready for performing a further etch step in order to remove an exposed portion of the layer 261B while using the portion 204B as an etch mask.

Figure 2E:
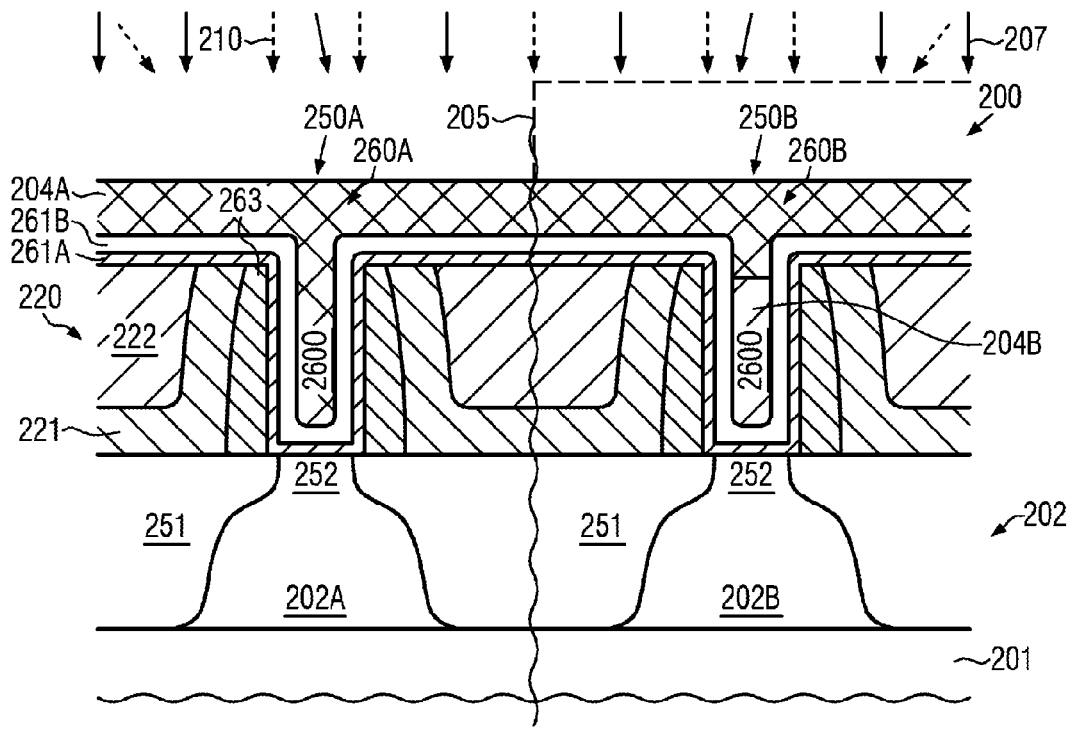

FIG. 2*e* schematically illustrates the device 200 according to further illustrative embodiments. In this case, the mask 205 may be removed on the basis of a wet chemical etch process 207 which may also use a significant material modification of at least an exposed portion of the layer 204, as indicated by 204A. To this end, in some illustrative embodiments, the process 207 may be performed on the basis of SPM (a mixture of sulfuric acid and hydrogen peroxide), thereby efficiently removing the resist mask 205 and initiating a pronounced oxidation of the sacrificial fill material 204. Consequently, due to the oxidizing ambient provided by the etch atmosphere 207, an oxide-like material may be formed from the layer 204, wherein the oxidation may also occur in an initially covered area of the layer 204, thereby also inducing a certain material modification in the gate opening 260O of the second gate electrode structure 260B. After the removal of the mask 205 and a desired degree of modification of the material 204, a further etch process 210 may be applied, for instance based on an appropriate wet chemical etch recipe in which the oxidized material 204A may be efficiently removed. To this end, well-established etch chemistries on the basis of HF (hydrofluoric acid) may be applied. In this case, also the portion 204B may be preserved in the gate electrode structure 260B. In order to appropriately adjust the height of the preserved portion 204B, appropriate process parameters and initial height and thickness values for the materials 204, 205 may be readily determined on the basis of experiments and the like. Consequently, after the etch process 210, the layer 261B may be exposed above the gate electrode structure 260A and in an upper portion of the gate electrode structure 260B, as is also discussed above with reference to FIG. 2*d*.

Figure 2F:
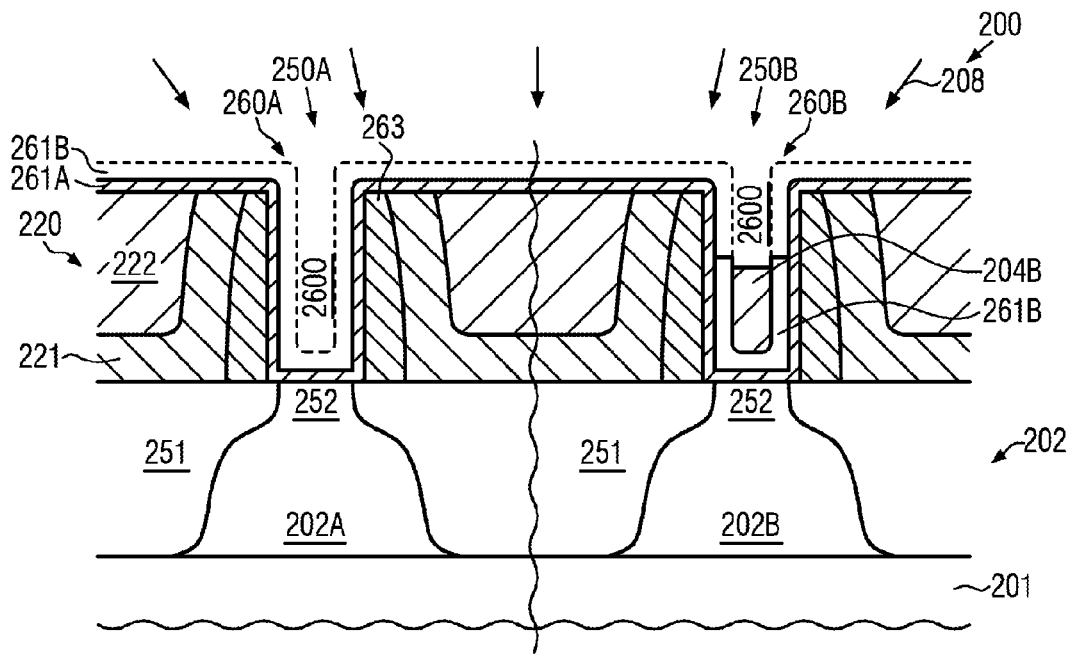

FIG. 2*f* schematically illustrates the semiconductor device 200 in a further advanced manufacturing stage. As shown, a further etch process 208 may be applied so as to remove exposed portions of the layer 261B. For example, in some illustrative embodiments, the layer 261B may be comprised of titanium nitride, which may be efficiently removed on the basis of SPM, while the remaining portion 204B may protect the portion 261B within the gate electrode structure 260B. In this case, the material 204B may be converted into an oxide-like material, which may be subsequently removed by HF and the like, as discussed above. In other illustrative embodiments, the exposed portion of the layer 261B may be efficiently removed by using a wet chemistry on the basis of hydrogen peroxide at elevated temperatures, for instance at a temperature of 40-80° C., for instance at approximately 50° C. Also in this case, the remaining portion 204B of the sacrificial fill material may be converted into an oxide-like material, which may then be removed in a later manufacturing stage, for instance by diluted HF and the like.

Figure 2G:
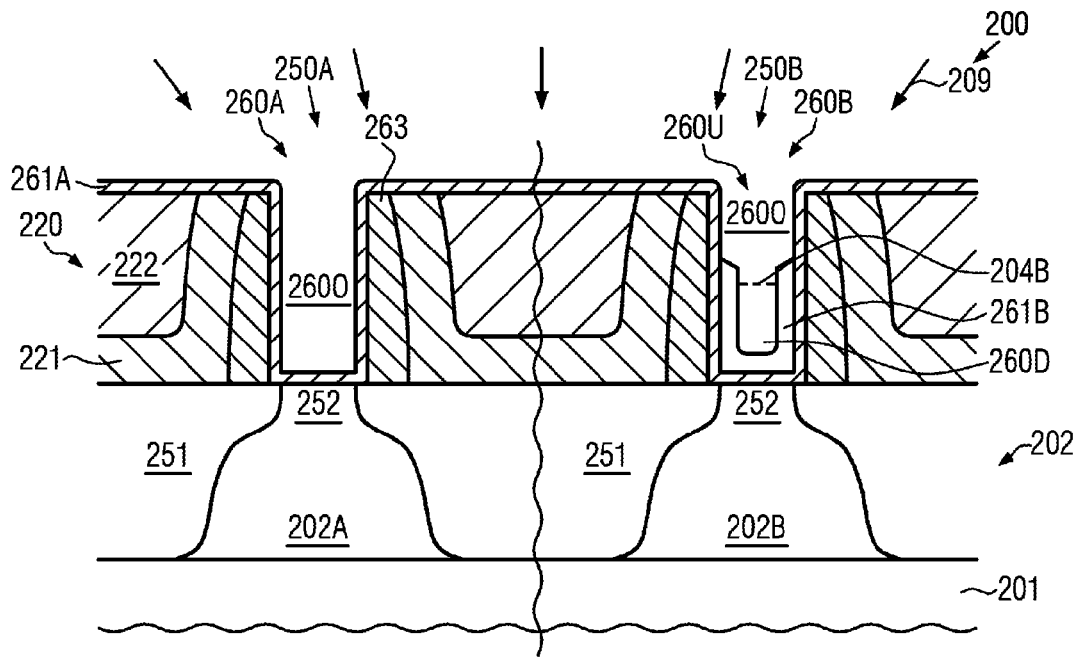

FIG. 2*g* schematically illustrates the device 200 during a further etch process 209, which may be performed as a wet chemical etch process so as to remove the sacrificial fill material 204B from the gate opening 260O of the gate electrode structure 260B. For example, as discussed above, the etch process 209 may be performed on the basis of HF, which may thus efficiently remove the modified material 204B, while nevertheless a high degree of selectivity is achieved with respect to materials such as titanium nitride, tantalum nitride, the interlayer dielectric material and the like. Any further sacrificial material that has not been converted into a silicon oxide like material during the previous etch process 208 (FIG. 2*f*) may be removed by other wet chemical agents, such as ACT970 that is commercially available. In this manner, the portion 261B may still be efficiently preserved in the lower portion 260D, while, on the other hand, the upper portion 260U may have a significantly increased length, thereby also efficiently reducing the effective aspect ratio of the opening 260O of the gate electrode structure 260B in view of a deposition of an electrode metal in a later manufacturing stage. Consequently, by removing the material 261B from the upper portion 260U, the length of the opening 260O may be increased by twice the thickness of the layer 261B, which may be approximately 10 nm, depending on the overall process and device requirements.

Figure 2H:
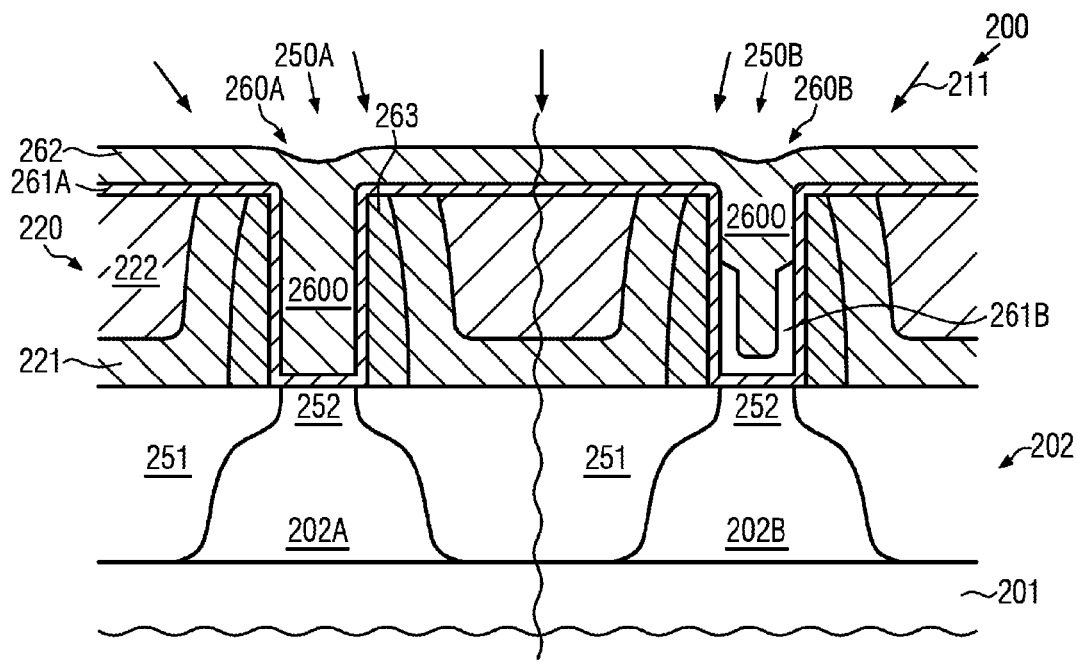

FIG. 2*h* schematically illustrates the device 200 in a further advanced manufacturing stage. As shown, a deposition process 211 may be performed so as to provide an electrode metal 262, such as aluminum, aluminum alloys and the like, in order to fill the gate openings 260O in a reliable manner. Due to the superior cross-sectional shape of the gate opening 260O in the gate electrode structure 260B, a reliable fill or at least a significant reduction of the probability of creating deposition-related irregularities may be achieved, even if a gate length of 40 nm and significantly less is to be implemented in the transistors 250A, 250B. Thus, any appropriate deposition process, for instance electroless deposition and the like, may be used, wherein, in even less critical applications, a CVD-based deposition recipe may be applied in combination with the deposition of an appropriate seed layer, since the selective removal of the material 261B from the upper portion of the gate electrode structure 260B may provide additional process robustness.

Figure 2I:
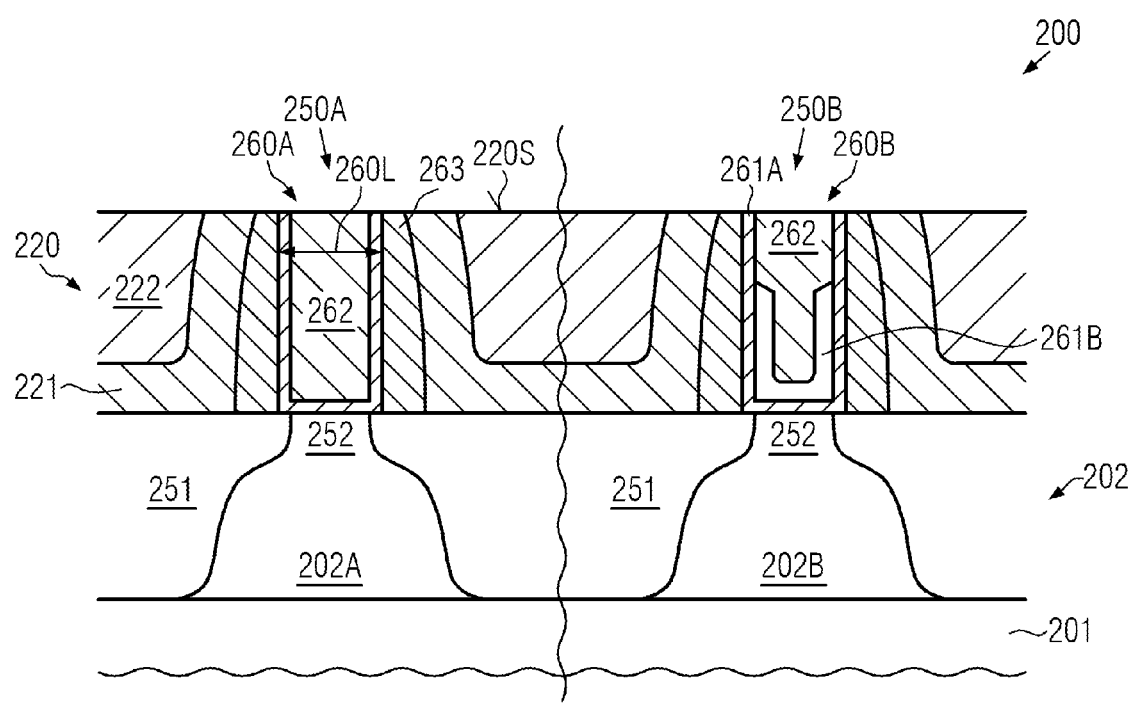

FIG. 2i schematically illustrates the device 200 in a further advanced manufacturing stage. As shown, any excess material of the layer 262 may be removed, for instance by chemical mechanical polishing (CMP), electro-etching, electro-CMP, etching and the like, thereby providing a substantially planar surface 220S in the contact level 220. Consequently, the gate electrode structures 260A, 260B may be provided with a substantially constant gate length, as indicated by 260L, along the entire height of the gate electrode structures, thereby providing superior conditions for the subsequent formation of contact elements and the like. That is, contrary to some conventional approaches, as previously discussed with reference to the device 100, a corner rounding of the gate openings so as to provide superior fill conditions may not be required so that a reduced lateral pitch between closely spaced gate electrode structures may be implemented, without causing undue leakage paths and contact failures. On the other hand, the preserved portion 261B still ensures the appropriate work function and general electronic characteristics of the gate electrode structure 260B.

In some illustrative embodiments, the processing may be continued by forming a further dielectric material and patterning the same so as to form contact openings that may connect to the gate electrode structures 260A, 260B and to the drain and source regions 251, as required by the overall circuit layout of the device 200. In other cases, due to the superior cross-sectional architecture of the gate electrode structures 260A, 260B, i.e., due to the non-requirement of a widening of the gate electrode structures in an upper area thereof, also efficient self-aligned contact regimes may be applied, for instance prior to or after completing the gate electrode structures 260A, 260B. For example, prior to applying the replacement gate approach, i.e., prior to removing the placeholder material 264 (FIG. 2a), the dielectric material of the contact level 220 may be selectively removed with respect to the gate electrode structures 260A, 260B and thereafter any appropriate contact material may be filled in and an excess portion thereof may be removed, thereby forming corresponding self-aligned contact elements that connect to the drain and source regions 251 laterally adjacent to and electrically isolated from the gate electrode structures 260A, 260B. Thereafter, the further processing may be continued, as is, for instance, described above with reference to FIGS. 2a-2i.

As a result, the present disclosure provides manufacturing techniques and semiconductor devices in which the aspect ratio of critical gate openings may be reduced by selectively removing a final metal-containing electrode material in an upper portion of the gate opening, which may be accomplished in some illustrative embodiments substantially without contributing to increased overall process complexity. That is, the selective removal of an upper portion of the final metal-containing electrode material may be accomplished during a patterning sequence which may be required for removing the material under consideration from one type of gate electrode structure. In this manner, a significant reduction of the aspect ratio of the critical gate opening may be accomplished, for instance a reduction from approximately 10 to approximately 3 may be achieved.

The particular embodiments disclosed above are illustrative only, as the invention may be modified and practiced in different but equivalent manners apparent to those skilled in the art having the benefit of the teachings herein. For example, the process steps set forth above may be performed in a different order. Furthermore, no limitations are intended to the details of construction or design herein shown, other than as described in the claims below. It is therefore evident that the particular embodiments disclosed above may be altered or modified and all such variations are considered within the scope and spirit of the invention. Accordingly, the protection sought herein is as set forth in the claims below.

What is claimed:

1. A method, comprising:
    forming a metal-containing electrode material in a first gate opening of a first gate electrode structure of a first transistor and in a second gate opening of a second gate electrode structure of a second transistor;
    forming a sacrificial material selectively in said second gate opening so as to cover a portion of said metal-containing electrode material at a bottom of said second gate opening while exposing an upper portion of said metal-containing electrode material in an upper portion of said second gate opening and substantially an entirety of said metal-containing electrode material in said first gate opening;
    removing said exposed entirety of said metal-containing electrode material from said first gate opening and said exposed upper portion of said metal-containing electrode material from said second gate opening while using said sacrificial material as an etch mask so as to preserve a lower portion of said metal-containing electrode material at said bottom of said second gate opening;
    removing said sacrificial material from said second gate opening; and
    forming a conductive fill material in said first and second gate openings.

2. The method of claim 1, further comprising forming at least one further metal-containing electrode material in said first and second gate openings prior to forming said metal-containing electrode material.

3. The method of claim 1, wherein forming said sacrificial material comprises forming a first sacrificial layer in and above said first and second gate electrode structures, forming a second sacrificial layer above said first sacrificial layer and patterning said first and second sacrificial layers.

4. The method of claim 3, wherein patterning said first and second sacrificial layers comprises patterning said second sacrificial layer so as to preserve a portion thereof above said second gate electrode structure and performing an etch process so as to commonly remove said second sacrificial layer and a portion of said first sacrificial layer.

5. The method of claim 4, wherein performing said etch process comprises performing a plasma assisted etch process.

6. The method of claim 1, wherein forming said sacrificial material comprises forming a first sacrificial layer above said first and second gate electrode structures, forming a resist mask above said first sacrificial layer so as to expose said first sacrificial layer above said first gate electrode structure and modifying at least an exposed portion of said first sacrificial layer so as to obtain a second sacrificial layer.

7. The method of claim 6, wherein modifying at least an exposed portion of said first sacrificial layer comprises removing said resist mask by using a wet chemical etch recipe that oxidizes at least said exposed portion of said first sacrificial layer.

8. The method of claim 6, further comprising removing said second sacrificial layer by performing a wet chemical etch process.

9. The method of claim 1, wherein one of said first and second transistors is a P-channel transistor and the other one of said first and second transistors is an N-channel transistor.

10. The method of claim 9, wherein a width of at least one of said first and second gate openings is 40 nm or less.

11. The method of claim 1, wherein a common material removal process is used to remove said entirety of said metal-containing electrode material from said first gate opening and said upper portion of said metal-containing electrode material from said upper portion of said second gate opening.

12. The method of claim 1, wherein a common material removal process is used to expose at least said upper portion of said metal-containing electrode material in said upper portion of said second gate opening and substantially said entirety of said metal-containing electrode material in said first gate opening.

13. A method of forming gate electrode structures, the method comprising:
    forming a first gate opening in a first gate electrode structure and a second gate opening of a second gate electrode structure;
    forming a first metal-containing material layer on surface areas of said first and second gate openings;
    forming a second metal-containing material layer on said first metal-containing material layer;
    removing substantially an entirety of said second metal-containing material layer from said first gate opening and an upper portion of said second metal-containing material layer from an upper portion of said second gate opening during a common material removal process while preserving a lower portion of said second metal-containing material layer at a lower portion of said second gate opening; and
    forming an electrode metal on said first metal-containing material layer and on said lower portion of said second metal-containing material layer.

14. The method of claim 13, wherein removing said second metal-containing material layer comprises forming an etch mask from a sacrificial fill material selectively in said lower portion of said second gate opening.

15. The method of claim 14, wherein forming said etch mask comprises depositing said sacrificial fill material, forming a second etch mask above said sacrificial fill material so as to expose said sacrificial fill material above said first gate electrode structure and removing said second etch mask and at least an exposed portion of said sacrificial fill material by performing a plasma assisted etch process.

16. The method of claim 14, wherein forming said etch mask comprises depositing said sacrificial fill material, forming a second etch mask above said sacrificial fill material so as to expose said sacrificial fill material above said first gate electrode structure, modifying at least an exposed portion of said sacrificial fill material and removing said second etch mask and at least said exposed portion of said sacrificial fill material.

17. The method of claim 16, wherein modifying at least an exposed portion of said sacrificial fill material and removing said second etch mask comprises performing a common wet chemical process.

18. The method of claim 17, wherein said common wet chemical process is performed by using a mixture of sulfuric acid and hydrogen peroxide.

19. The method of claim 16, wherein at least said exposed portion of said sacrificial fill material is removed by a wet chemical process after removal of said second etch mask.

20. A method, comprising:
    forming a metal-containing electrode material in a first gate opening of a first gate electrode structure of a first transistor and in a second gate opening of a second gate electrode structure of a second transistor;
    forming a sacrificial material selectively in said second gate opening so as to cover a portion of said metal-containing electrode material at a bottom of said second gate opening while exposing said metal-containing electrode material in an upper portion of said second gate opening and in said first gate opening, wherein forming said sacrificial material selectively in said second gate opening comprises:
        forming a first sacrificial layer in said first and second gate openings and above said first and second gate electrode structures;
        forming a second sacrificial layer above said first sacrificial layer;
        patterning said second sacrificial layer so as to preserve a portion thereof above said second gate electrode structure; and
        performing an etch process so as to commonly remove said second sacrificial layer and a portion of said first sacrificial layer;
    removing said exposed metal-containing electrode material from said first gate opening while using said sacrificial material as an etch mask so as to preserve said metal-containing electrode material at said bottom of said second gate opening;
    removing said sacrificial material from said second gate opening; and
    forming a conductive fill material in said first and second gate openings.

21. A method of forming gate electrode structures, the method comprising:
    forming a first gate opening in a first gate electrode structure and a second gate opening in a second gate electrode structure;
    forming a first metal-containing material layer on surface areas of said first and second gate openings;
    forming a second metal-containing material layer on said first metal-containing material layer;
    removing said second metal-containing material layer from said first gate opening and from an upper portion of said second gate opening while preserving said second metal-containing material layer at a lower portion of said second gate opening, wherein removing said second metal-containing material layer comprises forming an etch mask from a sacrificial fill material selectively in said lower portion of said second gate opening, and wherein forming said etch mask comprises:
    depositing a sacrificial fill material;
    forming a second etch mask above said sacrificial fill material so as to expose said sacrificial fill material above said first gate electrode structure;
    modifying at least an exposed portion of said sacrificial fill material; and
    removing said second etch mask and at least said exposed portion of said sacrificial fill material; and
    forming an electrode metal on said first metal-containing material layer and on said second metal-containing material layer preserved at said lower portion of said second gate opening.

* * * * *